United States Patent
Berger et al.

(10) Patent No.: US 7,009,886 B1
(45) Date of Patent: Mar. 7, 2006

(54) INTEGRATED CIRCUIT MEMORY DEVICE WITH BIT LINE PRE-CHARGING BASED UPON PARTIAL ADDRESS DECODING

(75) Inventors: Neal Berger, Cupertino, CA (US); George Chia-Jung Chang, Cupertino, CA (US); Pearl Po-Yee Cheng, Los Altos, CA (US); Anne Pao-Ling Koh, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/893,809

(22) Filed: Jul. 19, 2004

(51) Int. Cl.
  *G11C 16/06* (2006.01)
(52) U.S. Cl. .......................... 365/185.25; 365/185.21; 365/240
(58) Field of Classification Search ........... 365/185.25, 365/185.21, 240
  See application file for complete search history.

(56) References Cited

U.S. PATENT DOCUMENTS

| | | |
|---|---|---|
| 5,029,130 A | 7/1991 | Yeh |
| 5,663,922 A | 9/1997 | Tailliet |
| 6,081,452 A * | 6/2000 | Ohta ..................... 365/185.25 |
| 6,097,657 A | 8/2000 | Ng et al. |

* cited by examiner

*Primary Examiner*—Huan Hoang
(74) *Attorney, Agent, or Firm*—DLA Piper Rudnick Gray Cary US LLP

(57) ABSTRACT

An integrated circuit memory device has an array of memory cells arranged in a plurality of rows and columns and a plurality of row lines and a plurality of column lines. Cells arranged in the same row are connected by a common row line, and cells arranged in the same column are connected by a common column line. Each cell in the array is addressed by an address signal which has a plurality of bits. A sense amplifier circuit is connectable to one or more of the plurality of column lines of the array. An address input terminal receives in series the plurality of bits of the address signal. Each of the column lines is connectable to a pre-charge voltage, in response to a read command. A decoder circuit receives the address signal and decodes the address signal as each of the plurality of bits is received and disconnects certain of the column lines to the pre-charge voltage in response to the decoding, and activates the sense amplifier circuit after all of the plurality of bits of the address signal are received.

14 Claims, 2 Drawing Sheets

INTEGRATED CIRCUIT MEMORY DEVICE WITH BIT LINE PRE-CHARGING BASED UPON PARTIAL ADDRESS DECODING

TECHNICAL FIELD

The present invention relates to an integrated circuit memory device and a method of operating such a device wherein the memory device, in response to a read command, pre-charges the bitlines based upon a partial address received through a serial line. More particularly, the present invention relates to a serially addressed integrated circuit memory device in which column lines are pre-charged based upon partial address and further received address bits are used to disconnect select column lines from the pre-charged voltage and to activate the sense amplifier after all of the address is received.

BACKGROUND OF THE INVENTION

Serially addressed integrated circuit memory devices are well known in the art. See, for example, U.S. Pat. Nos. 5,663,922 and 6,097,657. As shown in U.S. Pat. No. 5,663,922, it is well known in the art to decode a partial address received by a serially addressed integrated circuit memory device to activate and "read" various portions of the memory array. This mechanism of decoding the address signals as they are serially inputted increases the performance of such a device by reading as soon as possible those cells which are selected by the partial address. The shortcoming of U.S. Pat. No. 5,663,922 is that it does not address the problem of saving power; the '922 patent increases the total number of sense amplifiers and activates all of the sense amplifiers as the serial addresses is received and is decoded. As a result, the '922 patent does not teach an integrated circuit memory device with power saving as its consideration.

Similarly, U.S. Pat. No. 6,097,657 also does not teach activating the sensing amplifiers only after all the various addresses have been completed decoded thereby saving power to the sensing amplifier.

Accordingly, there is a need for an integrated circuit memory device that is rapid in that it decodes a partially received address in a serially addressed memory device as well as saving power in the operation of the memory device.

SUMMARY OF THE INVENTION

In the present invention an integrated circuit memory device comprises an array of memory cells that are arranged in a plurality of rows and columns with a plurality of row lines and a plurality column lines. The cells which are arranged in the same row are connected by a common row line and the cells which are arranged in the same column are connected by a common column line. Each cell in the array is addressed by an address signal having a plurality of bits. An address input receives the plurality of bits of the address signal in series. A sensing amplifier circuit is connectable to one or more of the plurality of column lines of the array. Each of the column lines is connectable to a pre-charged voltage in response to a read command. Finally, a decode circuit receives the address signal and decodes the address signal as each of the plurality bits is received and disconnects certain of the column lines to the pre-charged voltage in response to the decoding and activates the sense amplifier circuit after all of the plurality of bits of the address signal are received.

DETAILED DESCRIPTION OF THE INVENTION

Figure 1:
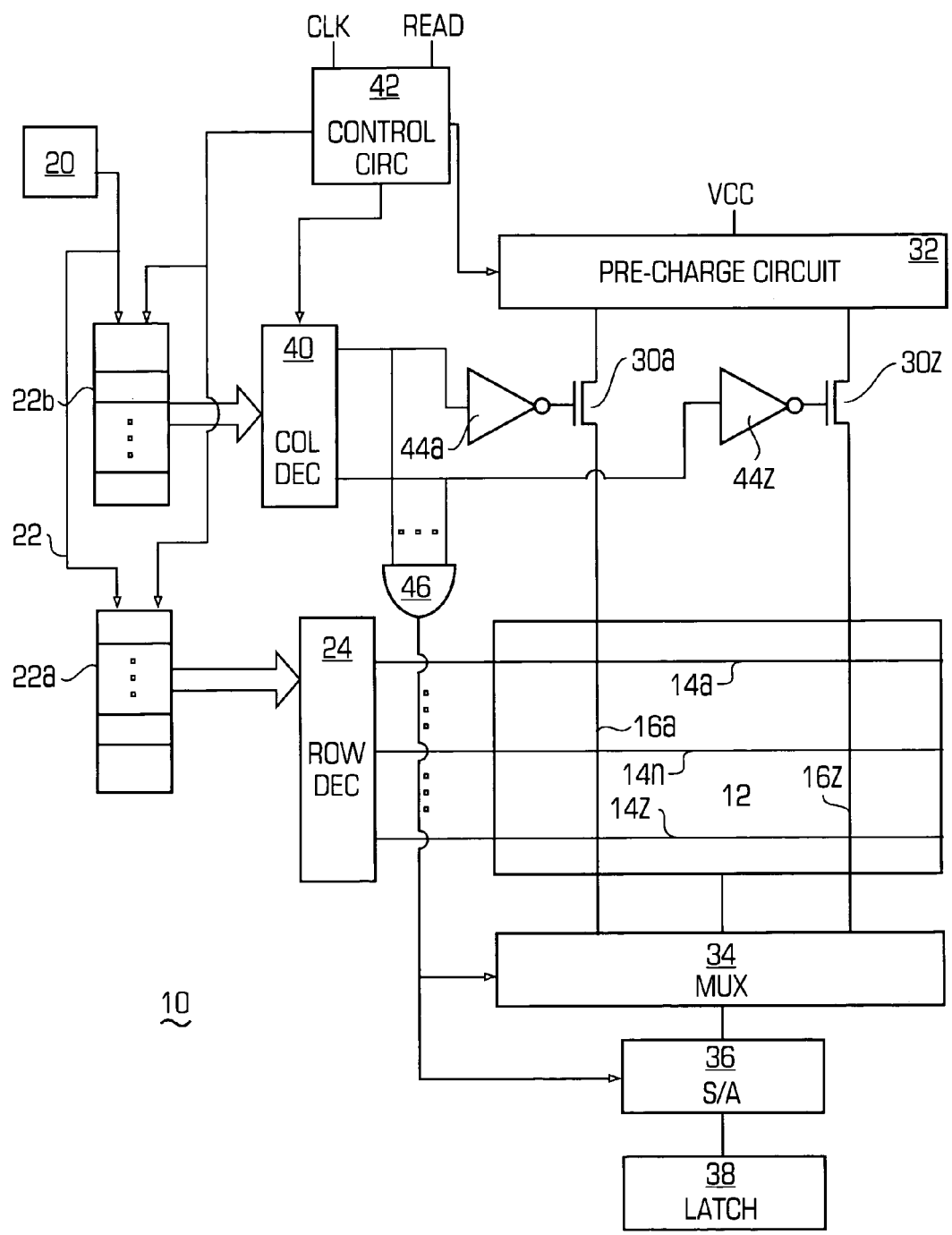
FIG. 1 is a block level schematic diagram of an integrated circuit memory device of the present invention.

Referring to FIG. 1 there is shown a block level diagram of an integrated circuit memory device 10 of the present invention. The device 10 comprises an array 12 of memory cells which are arranged in a plurality of rows and columns. As is well known in the art, the term rows and columns as used herein, may be interchanged. The array 12 further has a plurality of row lines 14 and a plurality row columns 16. Memory cells that are arranged in the same row, e.g. 14a, are connected by the common row line 14a. Memory cells which are arranged in the same column are connected by a common column line, such as column lines 16a. Each of the memory cells at the intersection of a column line and a row line is addressed by an address signal. The address signal is received at an address terminal 20. In the memory device 10, the address signal comprises a plurality of bits and is received in a serial manner. The address signal is applied to a shift register 22 comprising of a first shift register 22a and a second shift register 22b. As is well known in the art, typically the address signal has two components: a first component for the row address and a second component for the column address. Thus, the first component, the row address, is stored in the first shift register 22a and the second component the column address is stored in the second shift register 22b.

The memory device 10 also comprises a row address decoder 24 which receives the row address stored in the first shift register 22a. In response, the row address decoder 24 selects or activates one of the row lines 14 connected to the array 12. Each of the column lines 16 is connected through an MOS transistor switch 30 to a pre-charged circuit 32 to a source of voltage such as Vcc or another bias voltage. Each of the column lines 16 is also connected to a multiplexer 34 which is connected to a sense amplifier 36 whose output is connected to a latch 38.

The memory device 10 also comprises a column address decoder 40 which receives the second component of the address signal from the second shift register 22b. In response to the decoding of the address signal from the second shift register 22b, the column address decoder 40 controls the operations of each of the switches 30 (a–z), through an inverter 44, connecting or disconnecting each of the column lines 16 to the pre-charged circuit 32. Finally, the memory device 10 comprises a control circuit 42. The control circuit 42 receives an externally supplied clock signal and an externally supplied read command. In response thereto, the control circuit 42 controls the operation of the first and second shift registers 22a and 22b as well as the column address decoder 40 and the pre-charged circuit 32. The output of the column address decoder 40 is also used to control of the operation of the multiplexer 34 and to activate the sense amplifier 36 through a logic circuit 46, such an AND gate 46.

Figure 2:
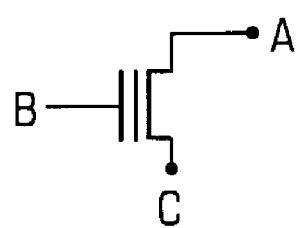
FIG. 2 is a circuit diagram of a non-volatile memory cell which can be used in the integrated circuit memory device which is shown in FIG. 1.
Figure 3:
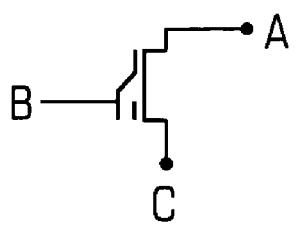
FIG. 3 is a circuit diagram of another non-volatile memory cell which can be used in the integrated circuit memory device shown in FIG. 1.

Referring to FIG. 2 that is shown a first embodiment of a non-volatile single storage transistor of the stacked gate floating gate type which can be used in the array 12 of the memory device 10. The operation of such a stacked gate floating gate storage transistor is well known in the art. Referring to FIG. 3 there is shown a split gate floating gate storage transistor which can also be used in the array 12 of the memory device 10. Such a split gate floating gate storage transistor as shown in FIG. 3 can be operated in accordance with the teaching as disclosed in U.S. Pat. No. 5,029,130 whose disclosure is incorporated herein by reference in its entirety. In particular, the split gate floating gate storage transistor is programmed by hot channel electron injection and is erased by Fowler-Nordheim tunneling of electrons from the floating gate to the control gate. For each of the cells of the type shown in FIG. 2 or 3, the row line is connected to the control gate, and the column line is connected to one of the terminals connected to the channel of the cell. Such connections are well known in the art.

The operation of the memory device 10 is as follows. The memory device 10 receives a read command by the control circuit 42. In response, the control circuit 42 activates the pre-charge circuit 32 connecting a pre-charged voltage to each of the column lines 16. As will be discussed hereinafter, this act of pre-charging each of the column lines 16 may be delayed until the start of the decoding of the column address portion of the address signal, thereby saving power. Alternatively, as discussed herein below, the connection of each of the column line(s) 16 to the pre-charging circuit 32 to the pre-charging voltage may be initiated by the first or subsequent bit of the column address.

The memory device 10 is assumed to receive an address signal having a plurality of bits in which the first component is the row address. In that event, the plurality of bits is first received and stored in the first shift register 22a. When the first shift register 22a is filled, the bits are read out in parallel and supplied to the row address decoder 24 which decodes the row address signal and selects a particular row line 14. The second component of the address signal, the column address, is then supplied and stored bit by bit into the second shift register 22b. As each bit is received by the second shift register 22b, it is read out to the column address decoder 40 and is decoded. Since the first bit of the column address is the most significant bit, in lieu of the read command used to initiate the pre-charging sequence, the first bit or a subsequent bit (but prior to the last bit) of the column address may be used to connect all of the column line(s) 16 to the pre-charging circuit 32 to the pre-charging voltage. As each subsequent column address bit is received and is decoded, the column decoder 40 turns off the appropriate switches 30 thereby deselecting or turning off the unselected column lines 16 from the pre-charged voltage. When the column address is completely received in the second shift register 22b, the column address decoder 40 would have completely decoded the column address and would have deselected or turned off all of the unselected column lines 16 leaving only the selected column line(s) 16 connected to the pre-charged circuit 32 to the pre-charged voltage. At that moment, the completely decoded column address is then used to activate the multiplexer 34 to connect the selected column line(s) 16 to the sense amplifier 36. At the same time, when the column address is completely decoded, the column address decoder 40 also activates the sense amplifier 36 turning it on. Since the sense amplifier 36 is turned on at least one clock cycle after the selected column line(s) 16 has been raised to a pre-charged voltage, there will be a larger differential signal that is available at that time for the sense amplifier 36 to detect. The detected state of the cell connected to the selected column line(s) 16 is sensed by the sense amplifier 36 which is then stored in the latch 38.

As can be seen from the foregoing, there are many advantages to the apparatus and method of the present invention. First, by initiating the pre-charging of all the column lines and then during the pre-charging process, deselecting the unselected column lines as the partial column address is received and is decoded, speed of operation is increased. Further, by not enabling the sense amplifier 36 until the final column address signal is known, power dissipated by the sensing amplifier circuit 36 is saved and is applied only when it is needed. Finally, since the sense amplifier 36 is activated at least one clock cycle after the bit line(s) or the column line(s) are pre-charged, there will be a larger differential signal available at that time which increases the signal to noise ratio, further enhancing speed/power consumption tradeoffs.

What is claimed is:

1. An integrated circuit memory device comprising:
    an array of memory cells arranged in a plurality of rows and columns having a plurality of row lines and a plurality of column lines, with cells arranged in the same row connected by a common row line, and cells arranged in the same column connected by a common column line; wherein each cell in said array being addressed by an address signal having a plurality of bits;
    a sense amplifier circuit connectable to one or more of said plurality of column lines of said array;
    an address input terminal for receiving said plurality of bits of said address signal in series;
    each of said column lines connectable to a first voltage; and
    a decoder circuit for receiving said address signal and for decoding said address signal as each of said plurality of bits is received and for disconnecting certain of said column lines to said first voltage in response to said decoding; and for activating said sense amplifier circuit after all of said plurality of bits of said address signal are received.

2. The memory device of claim 1 wherein each of said cells is a non-volatile memory cell.

3. The memory device of claim 2 wherein each of said non volatile memory cells is a stacked gate floating gate non-volatile memory cell.

4. The memory device of claim 2 wherein each of said non volatile memory cells is a split gate floating gate non-volatile memory cell having a first region in a semiconductor substrate, a second region in said semiconductor substrate spaced apart from said first region by a channel region; a floating gate for controlling the conduction of current in a first portion of said channel region; a control gate for controlling the conduction of current in a second portion of said channel region; wherein said control gate is separated from said floating gate by an insulator permitting the Fowler Nordheim tunneling of electrons from said floating gate to said control gate.

5. The memory device of claim 1 further comprising a shift register; said shift register for receiving said plurality of bits of said address signal.

6. The memory device of claim 5 further comprising a row decoder for receiving a first portion of said plurality of bits of said address signal and for decoding said first portion and for selecting a row line in response thereto.

7. The memory device of claim 6 wherein said decoder circuit is a column decoder for receiving a second portion of said plurality of bits of said address signal and for decoding said second portion and for selecting a column line in response thereto.

8. The memory device of claim 1 further comprising a multiplexer, and wherein said sense amplifier circuit is connectable to said plurality of column lines through said multiplexer.

9. The memory device of claim 1 further comprising a plurality of switches, each interposed between a column line and said first voltage; wherein each of said switches is responsive to the output of said decoder circuit.

10. The memory device of claim 1 wherein each of said column lines is connectable to the first voltage in response to a read command, thereby initiating a pre-charging sequence.

11. The memory device of claim 1 wherein said address signal having a row address portion and a column address portion, wherein each of said row address portion and column address portion comprising a plurality of bits.

12. The memory device of claim 11 wherein each of said column lines is connectable to the first voltage in response to the first bit of said column address portion.

13. A method of operating an integrated circuit memory device, having an array of memory cells arranged in a plurality of rows and columns, with a plurality of row lines and a plurality of column lines, with memory cells in the same row connected by a common row line, and memory cells in the same column connected by a common column line, wherein each cell in said array being addressed by an address signal having a plurality of bits; said memory device further having a sense amplifier circuit connectable to at least one of said plurality of column lines, said method comprising:

receiving said plurality of bits of said address signal in series;

pre-charging said plurality of column lines of said array;

selectively deactivating the pre-charging of another plurality of column lines of said array, wherein said another plurality of column lines are unselected column lines;

activating said sense amplifier circuit for detecting the state of said addressed cell after all of said plurality of bits of said address signal are received.

14. The method of claim 13 further comprising:

activating said sense amplifier circuit at least one clock cycle after pre-charging said plurality of column lines of said array.

* * * * *